United States Patent
Borland et al.

(10) Patent No.: US 8,710,355 B2
(45) Date of Patent: *Apr. 29, 2014

(54) COMPOSITIONS AND PROCESSES FOR FORMING PHOTOVOLTAIC DEVICES

(75) Inventors: William J. Borland, Chapel Hill, NC (US); Howard David Glicksman, Durham, NC (US); Jon-Paul Maria, Raleigh, NC (US)

(73) Assignees: E I du Pont de Nemours and Company, Wilmington, DE (US); North Carolina State University

( * ) Notice: Subject to any disclaimer, the term of this patent is extended or adjusted under 35 U.S.C. 154(b) by 459 days.

This patent is subject to a terminal disclaimer.

(21) Appl. No.: 12/617,929

(22) Filed: Nov. 13, 2009

(65) Prior Publication Data
US 2010/0154875 A1   Jun. 24, 2010

Related U.S. Application Data

(60) Provisional application No. 61/139,758, filed on Dec. 22, 2008.

(51) Int. Cl.
*H01L 31/042* (2006.01)
(52) U.S. Cl.
USPC .......................................................... 136/255
(58) Field of Classification Search
USPC .......................................................... 136/255
See application file for complete search history.

(56) References Cited

U.S. PATENT DOCUMENTS

| | | | |
|---|---|---|---|
| 3,381,182 A | 4/1968 | Thornton | |
| 3,968,272 A | 7/1976 | Anand | |
| 4,105,471 A | 8/1978 | Yerkes et al. | |
| 4,153,907 A | 5/1979 | Kofron | |
| 4,278,704 A | 7/1981 | Williams | |
| 4,394,673 A | 7/1983 | Thompson et al. | |
| 4,486,232 A | 12/1984 | Nakatani et al. | |
| 4,643,913 A | 2/1987 | Okunaka et al. | |

(Continued)

FOREIGN PATENT DOCUMENTS

| | | |
|---|---|---|
| EP | 0591882 A1 | 4/1994 |
| EP | 0662521 A2 | 7/1995 |

(Continued)

OTHER PUBLICATIONS

Andrews, J. M., The role of the metal-semiconductor interface in silicon integrated circuit technology, J. Vac. Sci. Technol., Nov./Dec. 1974, pp. 972-984, vol. 11, No. 6, the American Vacuum Society.

(Continued)

*Primary Examiner* — Miriam Berdichevsky
*Assistant Examiner* — Dustin Q Dam

(57) ABSTRACT

Photovoltaic cells, including silicon solar cells, and methods and compositions for making such photovoltaic cells are provided. A silicon substrate having p-type silicon base and an n-type silicon layer is provided with a silicon nitride layer, an exchange metal in contact with the silicon nitride layer, and a non-exchange metal in contact with the exchange metal. This assembly is fired to form a metal silicide contact on the silicon substrate, and a conductive metal electrode in contact with the metal silicide contact. The exchange metal is from nickel, cobalt, iron, manganese, molybdenum, and combinations thereof, and the non-exchange metal is from silver, copper, tin, bismuth, lead, antimony, arsenic, indium, zinc, germanium, gold, cadmium, beryllium, and combinations thereof.

17 Claims, 15 Drawing Sheets

(56) References Cited

U.S. PATENT DOCUMENTS

| | | | |
|---|---|---|---|
| 4,737,197 | A | 4/1988 | Nagahara et al. |
| 5,118,362 | A | 6/1992 | St. Angelo et al. |
| 5,405,466 | A | 4/1995 | Naito et al. |
| 5,429,657 | A | 7/1995 | Glicksman et al. |
| 5,698,451 | A | 12/1997 | Hanoka |
| 6,679,938 | B1 | 1/2004 | Kim et al. |
| 7,741,013 | B2 | 6/2010 | Keusseyan |
| 2003/0000568 | A1* | 1/2003 | Gonsiorawski ............... 136/251 |
| 2004/0016456 | A1* | 1/2004 | Murozono et al. ............ 136/250 |
| 2004/0231758 | A1 | 11/2004 | Hampden-Smith et al. |
| 2006/0225775 | A1* | 10/2006 | Ishihara ........................ 136/244 |
| 2006/0231801 | A1 | 10/2006 | Carroll et al. |
| 2007/0137692 | A1* | 6/2007 | Carlson ........................ 136/252 |
| 2007/0148336 | A1 | 6/2007 | Backrach et al. |
| 2007/0230088 | A1* | 10/2007 | Fujimura et al. ............. 361/311 |
| 2009/0101190 | A1 | 4/2009 | Salami et al. |
| 2009/0159121 | A1 | 6/2009 | Yang et al. |
| 2010/0037939 | A1* | 2/2010 | Eickelmann et al. ......... 136/255 |
| 2010/0037941 | A1 | 2/2010 | Borland et al. |
| 2010/0037942 | A1 | 2/2010 | Borland et al. |
| 2010/0071754 | A1 | 3/2010 | Chang et al. |
| 2010/0163101 | A1 | 7/2010 | Kumar et al. |

FOREIGN PATENT DOCUMENTS

| | | | |
|---|---|---|---|
| EP | 1386708 | A2 * | 2/2004 |
| EP | 2172978 | A2 | 4/2010 |
| FR | 2549290 | A1 | 1/1985 |
| JP | 2004207493 | A | 7/2004 |
| WO | 8907343 | A1 | 8/1989 |
| WO | 2007/106180 | | 9/2007 |
| WO | 2008134417 | A1 | 11/2008 |
| WO | 2009009512 | A1 | 1/2009 |
| WO | 2009048983 | A2 | 4/2009 |
| WO | 2010019532 | A2 | 2/2010 |

OTHER PUBLICATIONS

Bahr, M. et al., A New Approach for the Front Side Metallization of Industrial Type Silicon Solar Cells Using Structurization by Etching, Presented at the 22nd European Photovoltaic Solar Energy Conference, Sep. 3-9, 2007, Milan, Italy.

U.S. Appl. No. 12/536,227, filed Aug. 5, 2009.

U.S. Appl. No. 12/536,238, filed Aug. 5, 2009.

U.S. Appl. No. 12/539,677, filed Aug. 12, 2009.

Richardson, F. D. et al., The Thermodynamics of Substances of Interest in Iron and Steel Making from 0 degrees C to 2400 degrees C, Journal of The Iron and Steel Institute, Nov. 1948, pp. 261-270, British Iron and Steel Research Association.

Hansen, Max, Constitution of Binary Alloys, Second Edition, 1958, pp. 504-505, 1040-1041, McGraw-Hill Book Company.

Lee, S. H., Cost Effective Process for high-efficiency solar cells, Nanotechnology Materials and Devices Conference, IEEE, Oct. 22, 2006, pp. 526-528, Piscataway, NJ.

Saito, T. et al., Solar energy absorber mfd. From composite layer containing metal matrix and particles of metal, boride, carbide, nitride, silicide, oxide, graphite, or carbon, WPI/Thomson, Jul. 22, 1982, Matsushita Electric Works, Ltd.

Kim, Joondong et al., Metal silicide-mediated microcrystalline silicon thin-film growth for photovoltaics, Solar Energy Materials & Solar Cells, 2007, pp. 534-538, vol. 91, Elsevier, B.V.

International Search Report dated May 25, 2011, International Application No. PCT/US2009/068914.

* cited by examiner

COMPOSITIONS AND PROCESSES FOR FORMING PHOTOVOLTAIC DEVICES

FIELD OF THE INVENTION

This invention is directed primarily to a silicon solar cell device. In particular, it is directed to compositions and processes for use in forming electrical contacts to the n-type silicon of a solar cell device.

BACKGROUND OF THE INVENTION

The present invention can be applied to a range of semiconductor devices, although it is especially effective in light-receiving elements such as photodetectors and solar cells. The background of the invention is described below with reference to solar cells as a specific example of the prior art.

Conventional terrestrial solar cells are generally made of thin wafers of silicon (Si) in which a rectifying or p-n junction has been created and electrode contacts, that are electrically conductive, have been subsequently formed on both sides of the wafer. A solar cell structure with a p-type silicon base has a positive electrode contact on the base or backside and a negative electrode contact on the n-type silicon or emitter that is the front-side or sun-illuminated side of the cell. The "emitter" is a layer of silicon that is doped in order to create the rectifying or p-n junction and is thin in comparison to the p-type silicon base. It is well-known that radiation of an appropriate wavelength incident on a p-n junction of a semiconductor body serves as a source of external energy to generate hole-electron pairs in the semiconductor body. Because of the potential difference which exists at a p-n junction, holes and electrons move across the junction in opposite directions. The electrons move to the negative electrode contact, and the holes move to positive electrode contact, thereby giving rise to flow of an electric current that is capable of delivering power to an external circuit.

FIG. 1 is a process flow diagram, shown in side elevation, illustrating the fabrication of a semiconductor device according to conventional processes and materials.

In FIG. 1A, a p-type silicon substrate 10 is provided. The substrate may be composed of single-crystal silicon or of multicrystalline silicon. As shown in FIG. 1B, an n-type layer 20 in FIG. 1B, is formed to create a p-n junction. The method used to form the n-type layer is generally by the thermal diffusion of a donor dopant from Group V of the periodic table, preferably phosphorus (P), using phosphorus oxychloride ($POCl_3$). The depth of the diffusion layer is generally about 0.3 to 0.5 micrometers (μm). The phosphorus doping causes the surface resistance of the silicon to be reduced to between several tens of ohms per square ($\Omega/\square$) to something less than 100 ohms per square ($\Omega/\square$). In the absence of any particular modification, the diffusion layer 20 is formed over the entire surface of the silicon substrate 10.

Next, one surface of this diffusion layer is protected with a resist or the like and the diffusion layer 20 is removed from all but one surface of the article of FIG. 1B by etching. The resist is removed, leaving the article of FIG. 1C.

Next, as shown in FIG. 1D, an insulating silicon nitride $Si_3N_4$ film, or a silicon nitride SiNx:H film is formed on the above-described n-type diffusion layer to form an anti-reflective coating (ARC). The thickness of the $Si_3N_4$ or SiNx:H anti-reflective coating 30 is about 700 to 900 Å. As an alternative to silicon nitride, silicon oxide may be used as an anti-reflection coating.

As shown in FIG. 1E a silver paste 50 for the front electrode is screen printed and then dried over the silicon nitride film 30. In addition, an aluminum paste 60 and a backside silver or silver/aluminum paste 70 are screen printed and successively dried on the backside of the substrate. Co-firing of front and backside pastes is then carried out in an infrared furnace at a temperature range of approximately 700° C. to 975° C. in air for a period of from several minutes to several tens of minutes.

As shown in FIG. 1F, aluminum diffuses from the aluminum paste into the silicon substrate 10 as a dopant during firing, forming a p+ layer 40 containing a high concentration of aluminum dopant. This layer is generally called the back surface field (BSF) layer, and helps to improve the energy conversion efficiency of the solar cell.

Firing also converts the aluminum paste 60 to an aluminum back electrode 61. The backside silver or silver/aluminum paste 70 is fired at the same time, becoming a silver or silver/aluminum back electrode 71. During firing, the boundary between the back side aluminum and the back side silver or silver/aluminum assumes an alloy state, thereby achieving electrical connection. The aluminum electrode also dopes the silicon to form a p+ layer 40. Because soldering to an aluminum electrode is impossible, a silver back tab electrode is formed over portions of the back side as an electrode for interconnecting solar cells by means of copper ribbon or the like.

During the co-firing, the front electrode-forming silver paste 50 sinters and penetrates through the silicon nitride film 30, and is thereby able to electrically contact the n-type layer 20. This type of process is generally called "fire through" or "etching" of the silicon nitride This fired through state is apparent in layer 51 of FIG. 1F.

Conventional front electrode silver pastes contain silver powder, an organic binder, a solvent, a glass frit and may contain various additives. The silver powder functions as the main electrode contact material and provides for low resistance. The glass frit may contain lead or other low melting point constituents to give a softening point of about 300 to 600° C. The glass frit also provides for adhesion of the sintered silver to the silicon. Additives may be used as additional dopants to modify the n-type conductivity. During firing, the glass melts and penetrates through the silicon nitride film so that the silver electrically contacts the n-type silicon layer. The interface structure after firing consists of multiple phases: substrate silicon; silver-silicon islands; silver precipitates within an insulating glass layer; and bulk sintered silver. As a result, the contact mechanism is a mix of ohmic contact by the silver-silicon islands and silver precipitates and tunneling through thin layers of the glass. The electrode contacts to the solar cell are important to the performance of the cell. A high resistance silicon/electrode contact interface will impede the transfer of current from the cell to the external electrodes and therefore, reduce efficiency. Compositions and firing profiles, therefore, of the conductive paste are optimized to maximize cell efficiency. However, the presence of glass at the metal-silicon interface inevitably results in a higher contact resistance than would be realized by a pure metal contact to silicon.

Difficulties associated with forming low resistance contacts to bipolar silicon devices exist. All elemental semiconductor contacts have a potential barrier that makes the contact rectifying. A Schottky barrier height (SBH) is the rectifying barrier for electrical conduction across a metal-semiconductor (MS) junction and, therefore, is of vital importance to the successful operation of any semiconductor device. The magnitude of the SBH reflects the mismatch in the energy position of the majority carrier band edge of the semiconductor and the metal Fermi level across the MS interface. At a metal/n-type semiconductor interface, the SBH is the difference between the conduction band minimum and the Fermi level. The lower the SBH, the better the contact to silicon. Low Schottky barrier height contacts to n-type silicon semiconductor devices are known. U.S. Pat. Nos. 3,381,182, 3,968,272 and 4,394,673, for example, disclose various silicides that form low SBH contacts to bipolar silicon devices when the metal is placed in contact with the silicon and heated. United State Patent Application No. 61/088,504 to Borland et al., discloses the use of metal nitrides as low Schottky barrier height contacts formed by reaction of silicon nitride with metals from Group 4B and 5B of the periodic table wherein some metal silicide formation may occur. Glass free pure silicide contacts to n-type silicon for front face electrode contacts to silicon solar cells are not disclosed.

Novel compositions and processes for forming front electrode contacts of photovoltaic devices are needed which provide superior reduction in contact resistance, maintain good adhesion and use safe, inexpensive and readily available materials and processes.

SUMMARY OF THE INVENTION

A method for making a photovoltaic device is disclosed in which a silicon substrate having a p-type base and an n-type silicon layer is provided. A silicon nitride layer is formed on the n-type silicon layer of the silicon substrate. An exchange metal is placed in contact with the silicon nitride layer and a non-exchange metal is placed in contact with the exchange metal. The silicon substrate, silicon nitride layer, exchange metal and non-exchange metal are fired to form a metal silicide contact to the n-type silicon layer and a conductive metal electrode in contact with the metal silicide contact. The exchange metal may be one or more metals from the group cobalt, nickel, iron, manganese, and molybdenum, and combinations thereof. The non-exchange metal is preferably from the group of silver, copper, tin, bismuth, lead, antimony, zinc, indium, gold, cadmium, beryllium, and combinations thereof. The metal silicide contact provides a low Schottky barrier height contact to the n-type silicon layer. A photovoltaic device can be made by this method so as to include such metal silicide contacts.

In one embodiment, the exchange metal placed in contact with the silicon nitride layer on the n-type silicon layer of the silicon substrate and the non-exchange metal placed in contact with the exchange metal are both coated with a flux. In another disclosed embodiment, the exchange metal and the non-exchange metal are combined to form a metals composition, and the metals composition is subsequently deposited on the n-type silicon layer of the silicon substrate. The exchange metal is preferably in the form of particles having an average diameter of between and including any two of the following diameters: 0.2, 0.5, 1, 3, 5 and 10 micrometers. The non-exchange metal is preferably in the form of particles having an average diameter of between and including any two of the following diameters: 0.2, 0.5, 1, 3, 5 and 10 micrometers.

In one disclosed embodiment, exchange metal and non-exchange metal of the metals composition are in the form of an alloy of exchange and non-exchange metals, and the alloy may be in the form of alloy particles that preferably have an average diameter of between and including any two of the following diameters: 0.2, 0.5, 1, 3, 5 and 10 micrometers. Preferably, the exchange metal forms between 1 and 40 weight percent of the total metals in the metals composition. In one disclosed embodiment, the alloy metal particles are coated with a flux.

In one disclosed embodiment, the silicon substrate, silicon nitride layer, exchange metal and non-exchange metal are fired at a temperature between 400° C. and 950° C. In one embodiment, the silicon substrate, silicon nitride layer and exchange metal are fired in a low oxygen atmosphere having an oxygen partial pressure less than or equal to $10^{-6}$ atmospheres. Firing in a nitrogen rich atmosphere is disclosed. In another embodiment, the exchange metal and non-exchange metal are coated with a flux and are fired in an air atmosphere at a temperature between 400° C. and 950° C.

A method for making a silicon solar cell is also disclosed. According to the disclosed method, a silicon substrate having a p-type silicon base and an n-type silicon layer is provided; a silicon nitride antireflective layer is formed on the n-type silicon layer of the silicon substrate; an exchange metal is placed in contact with said silicon nitride antireflective layer; a non-exchange metal is placed in contact with the exchange metal; and the silicon substrate, silicon nitride layer, exchange metal and non-exchange metal are fired to form a metal silicide contact to the n-type silicon layer and a conductive metal electrode in contact with the metal silicide contact. The exchange and non-exchange metals may be placed in contact with the silicon nitride antireflective layer by thin film deposition. Alternatively, the exchange and non-exchange metals may be placed in contact with the silicon nitride antireflective layer by thick film deposition. The thickness of the antireflective coating is preferably in the range of 70 to 100 nanometers. Disclosed exchange metals include nickel, cobalt, iron, manganese, molybdenum, and combinations thereof. Disclosed non-exchange metals include silver, copper, tin, bismuth, lead, antimony, arsenic, zinc, gold, cadmium, beryllium, and combinations thereof.

A thick film composition for producing an electrical contact on a silicon nitride antireflective layer of a photovoltaic cell is also disclosed. The thick film composition comprises one or more exchange metals selected from the group of nickel, cobalt, iron, manganese, molybdenum and combinations thereof; and one or more non-exchange metals selected from silver, copper, tin, bismuth, lead, antimony, arsenic, zinc, gold, cadmium, and beryllium and combinations thereof. The exchange and non-exchange metals are provided in an organic medium wherein the exchange metals and non-exchange metals are in the form of particles having an average diameter in the range of 0.2 to 10 micrometers. In one preferred embodiment, the exchange metals and non-exchange metals are alloyed and are in the form of particles of such alloy. The metal alloy particles may be coated with the flux. Also disclosed is a silicon solar cell having front face electrode contacts formed from this disclosed composition.

A photovoltaic device is also disclosed that comprises a substrate comprising an n-type silicon layer, a metal silicide contact disposed on and adhered to the n-type silicon layer where the metal is nickel, cobalt, iron, manganese, molybdenum and combinations thereof, and a conductive metal electrode adhered to and disposed on said metal silicide, where the conductive metal electrode is comprised of conductive metal selected from silver, copper, tin, bismuth, lead, antimony, arsenic, zinc, germanium, gold, cadmium, beryllium, and combinations thereof.

Figure 1A:
FIG. 1 is a process flow diagram, shown in side elevation, illustrating the fabrication of a semiconductor device according to conventional processes and materials.
Figure 1B:
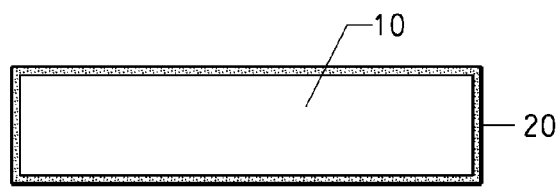
Figure 1C:

Reference numerals shown in FIG. 1 are explained below.
10: p-type silicon substrate
20: n-type diffusion layer
30: anti-reflective coating
40: p+ layer (back surface field, BSF)
50: silver paste formed on front side
51: silver front electrode (obtained by firing front side silver paste)
60: aluminum paste formed on backside
61: aluminum back electrode (obtained by firing back side aluminum paste)
70: silver or silver/aluminum paste formed on backside
71: silver or silver/aluminum back electrode (obtained by firing back side silver paste)

FIG. 2 shows calculated plots of free energy (Delta G) versus temperature for the reactions between silicon nitride and the following metals: nickel. cobalt, molybdenum, manganese, and iron at a partial pressure of nitrogen of one atmosphere.

Figure 3:
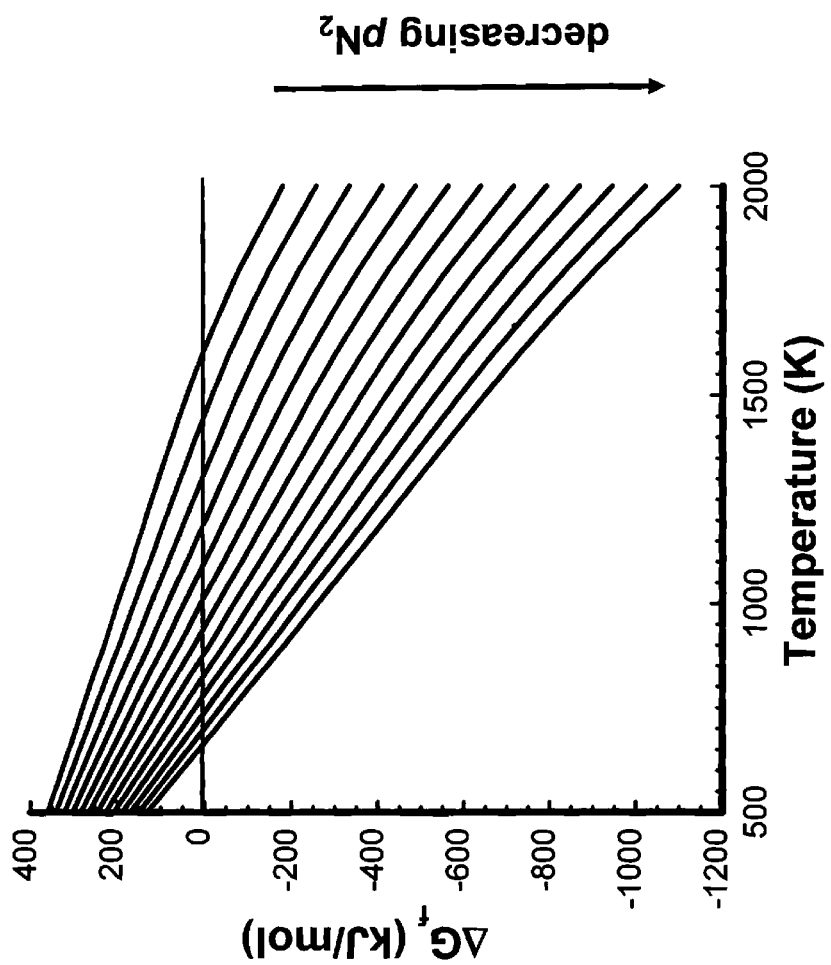

FIG. 3 shows a calculated plot of free energy (Delta G) versus temperature for the reaction between silicon nitride and nickel under various partial pressures of nitrogen.

Figure 4:
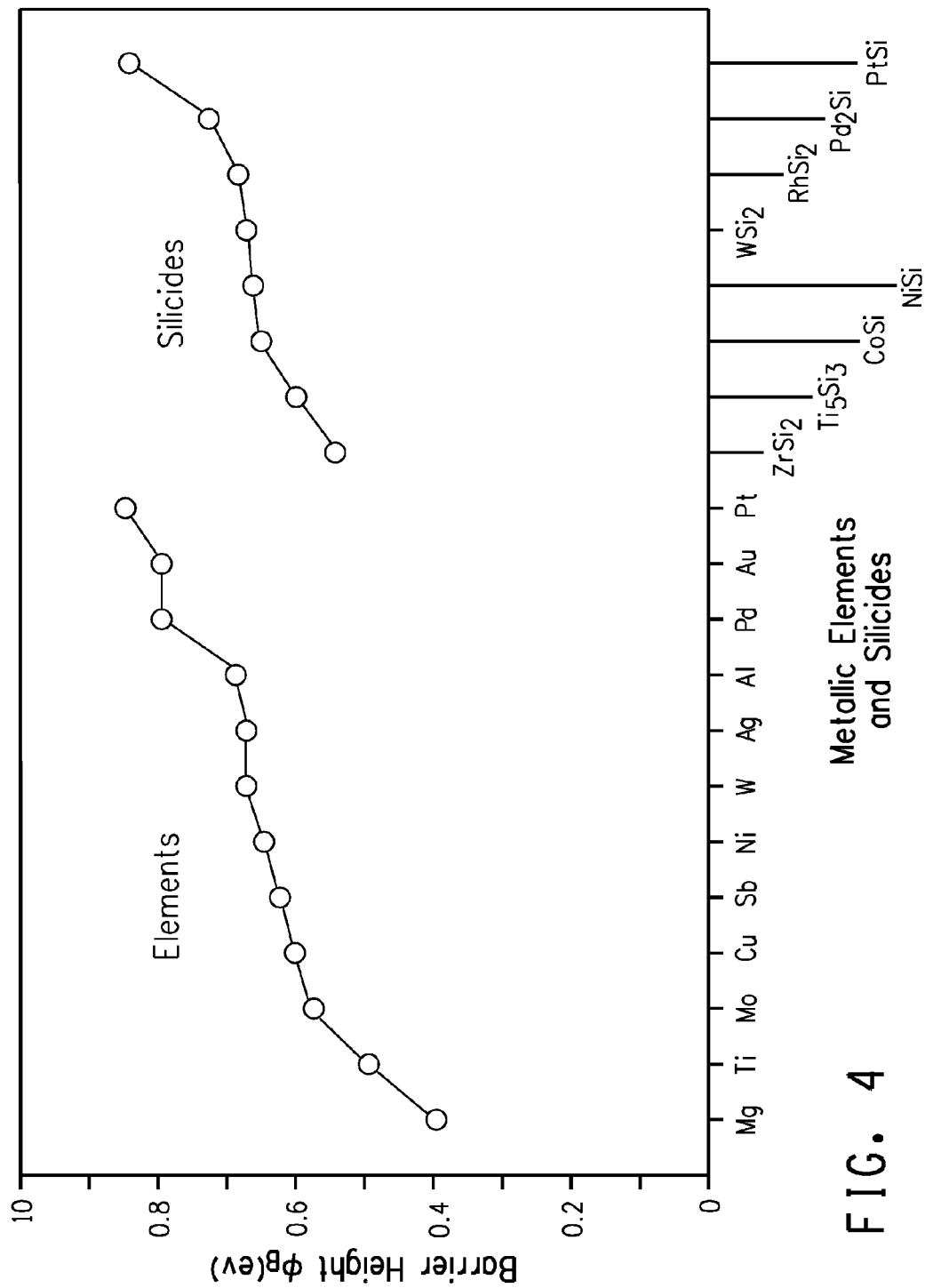

FIG. 4 shows Schottky barrier heights of various metals, and silicides to n-type silicon.

FIG. 5 shows in side elevation a method of manufacturing a silicon solar cell according to the present invention.

Figure 6:
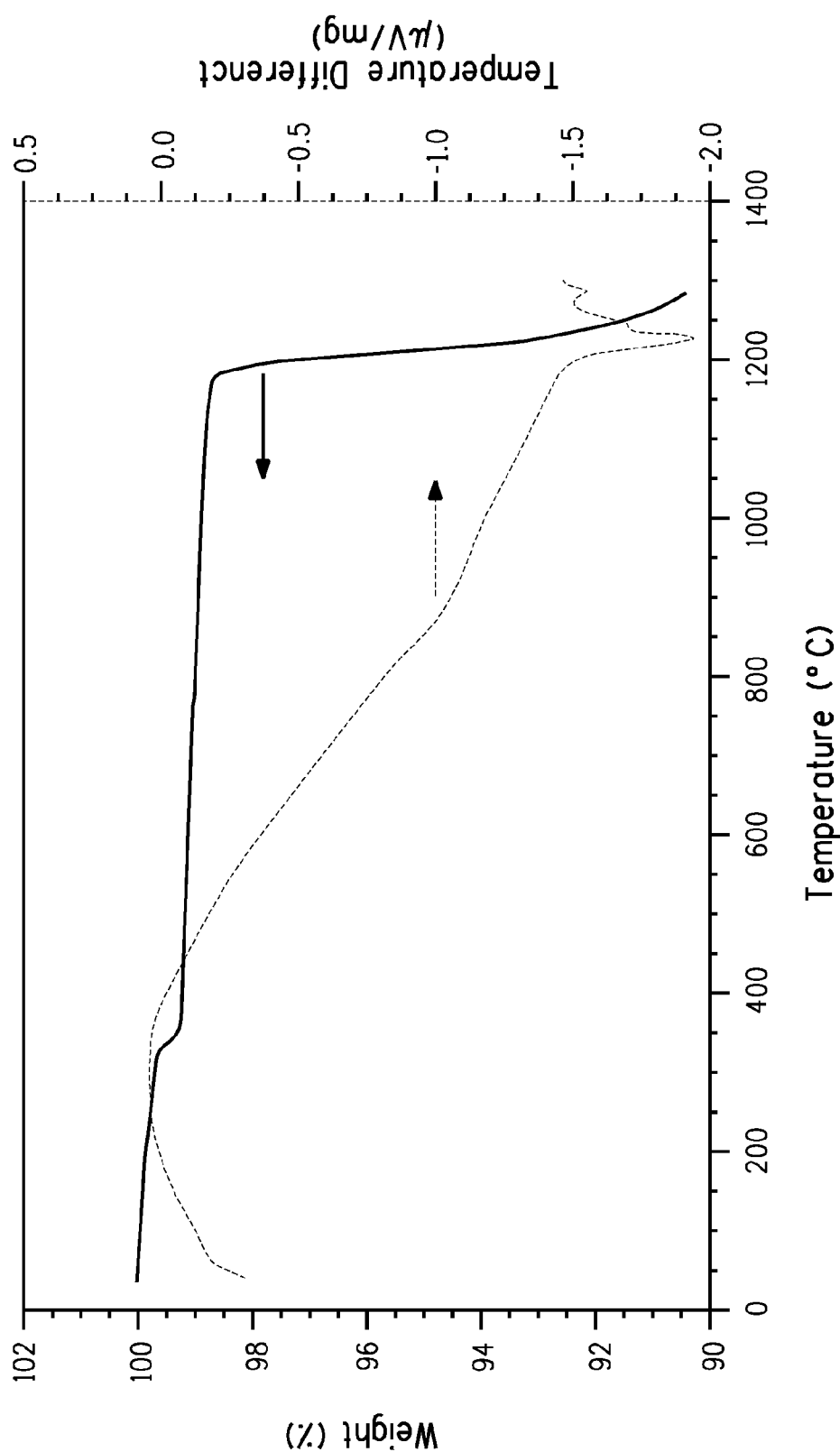
Figure 7:
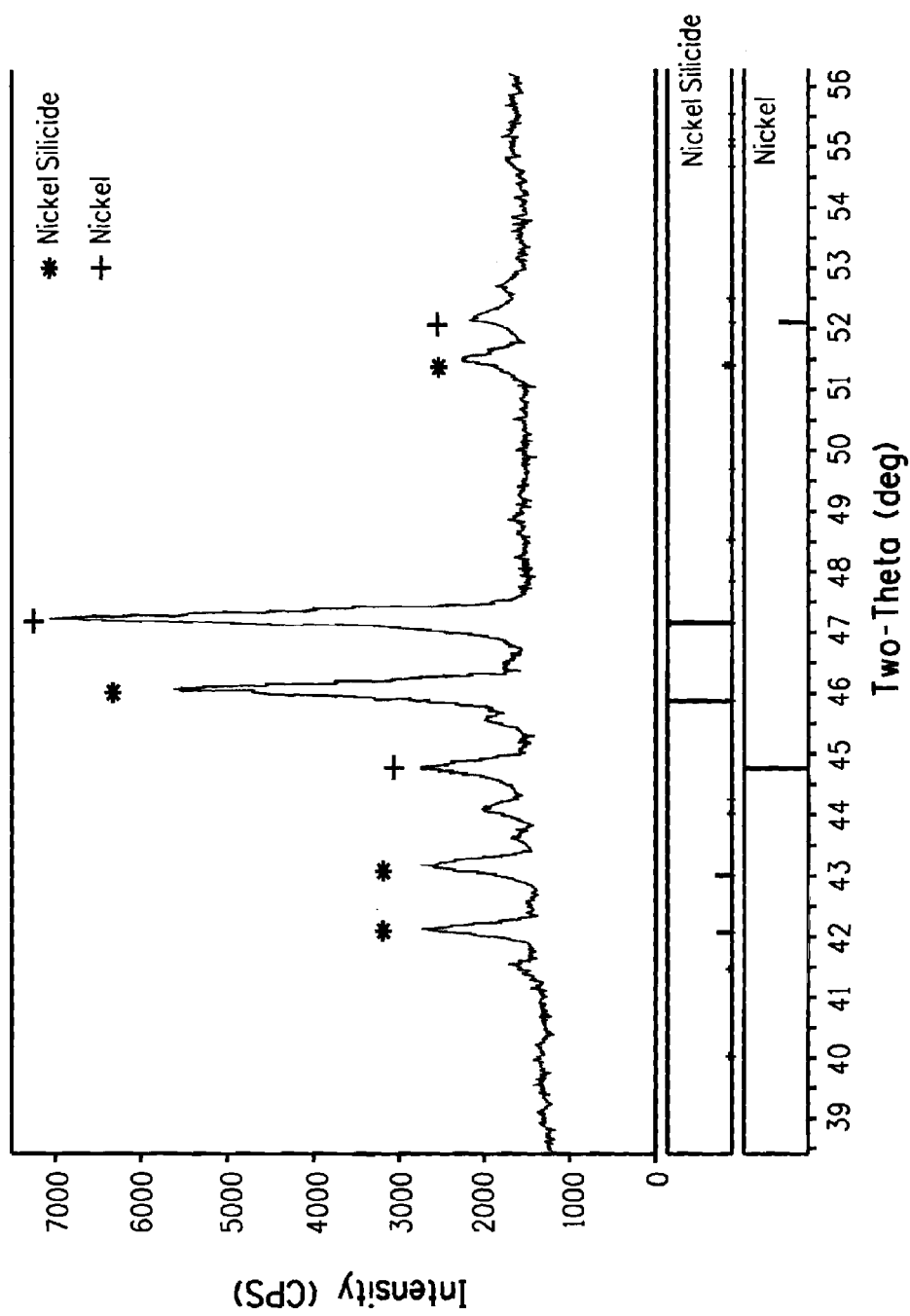
Figure 8:
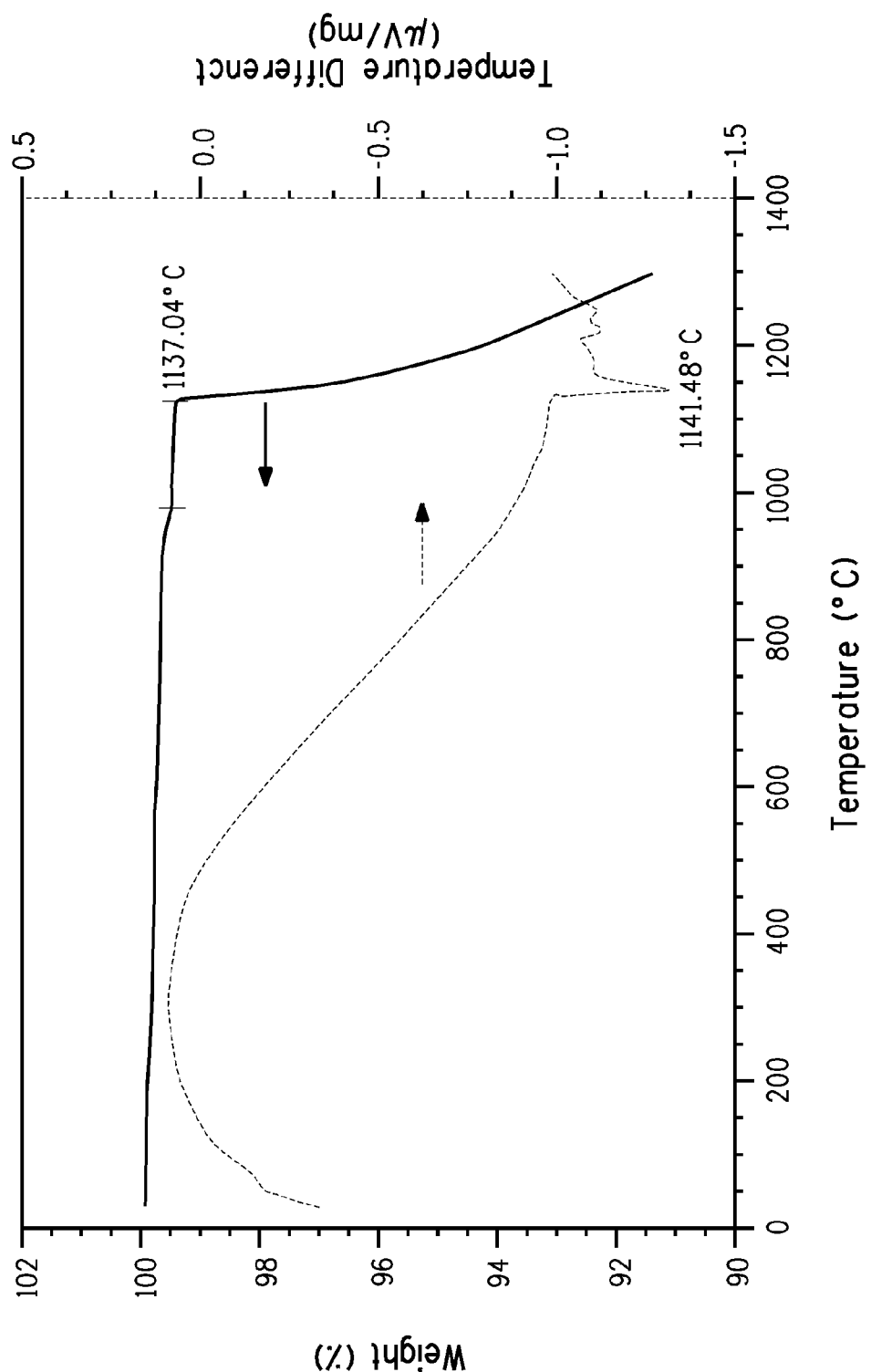
Figure 9:
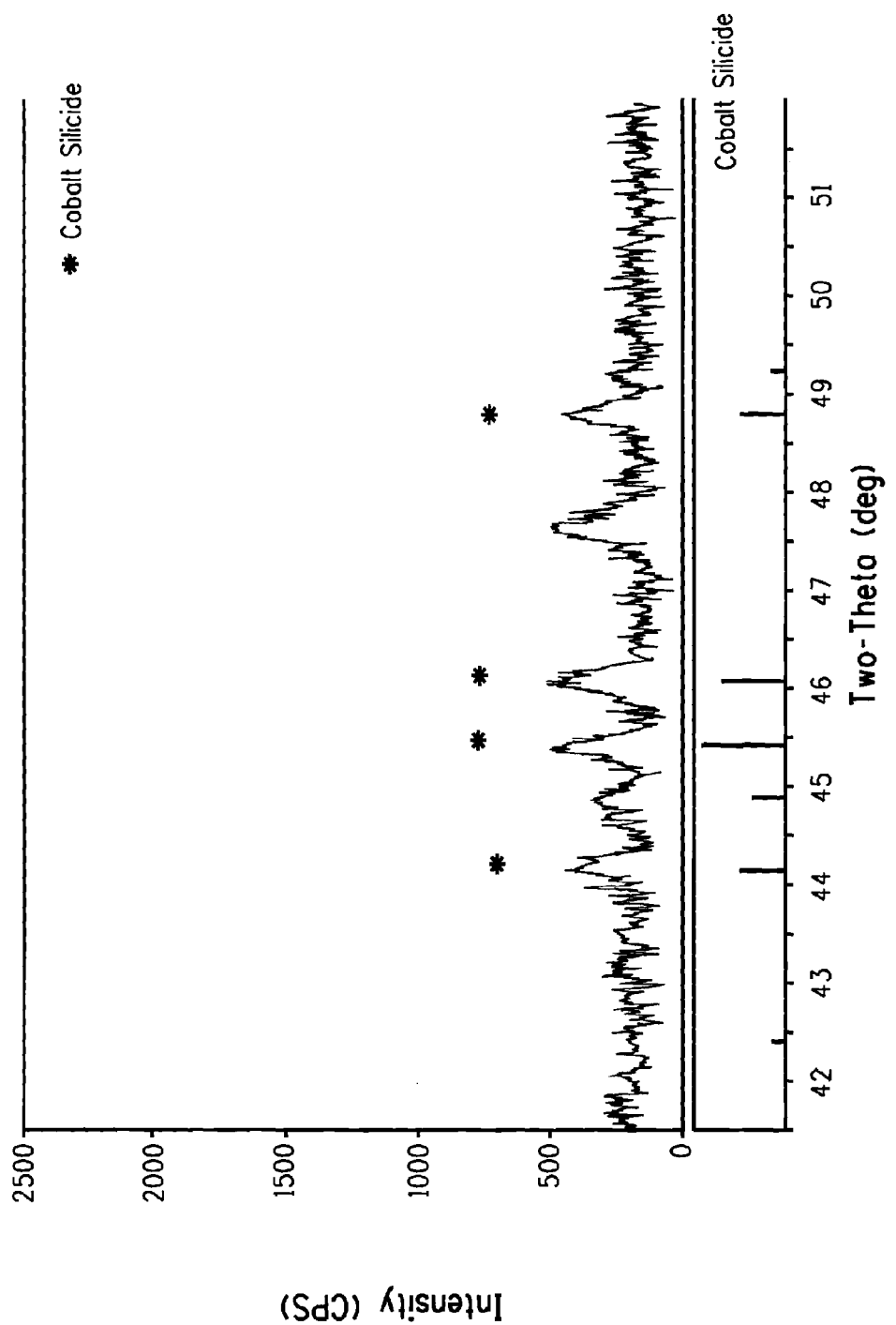
Figure 10:
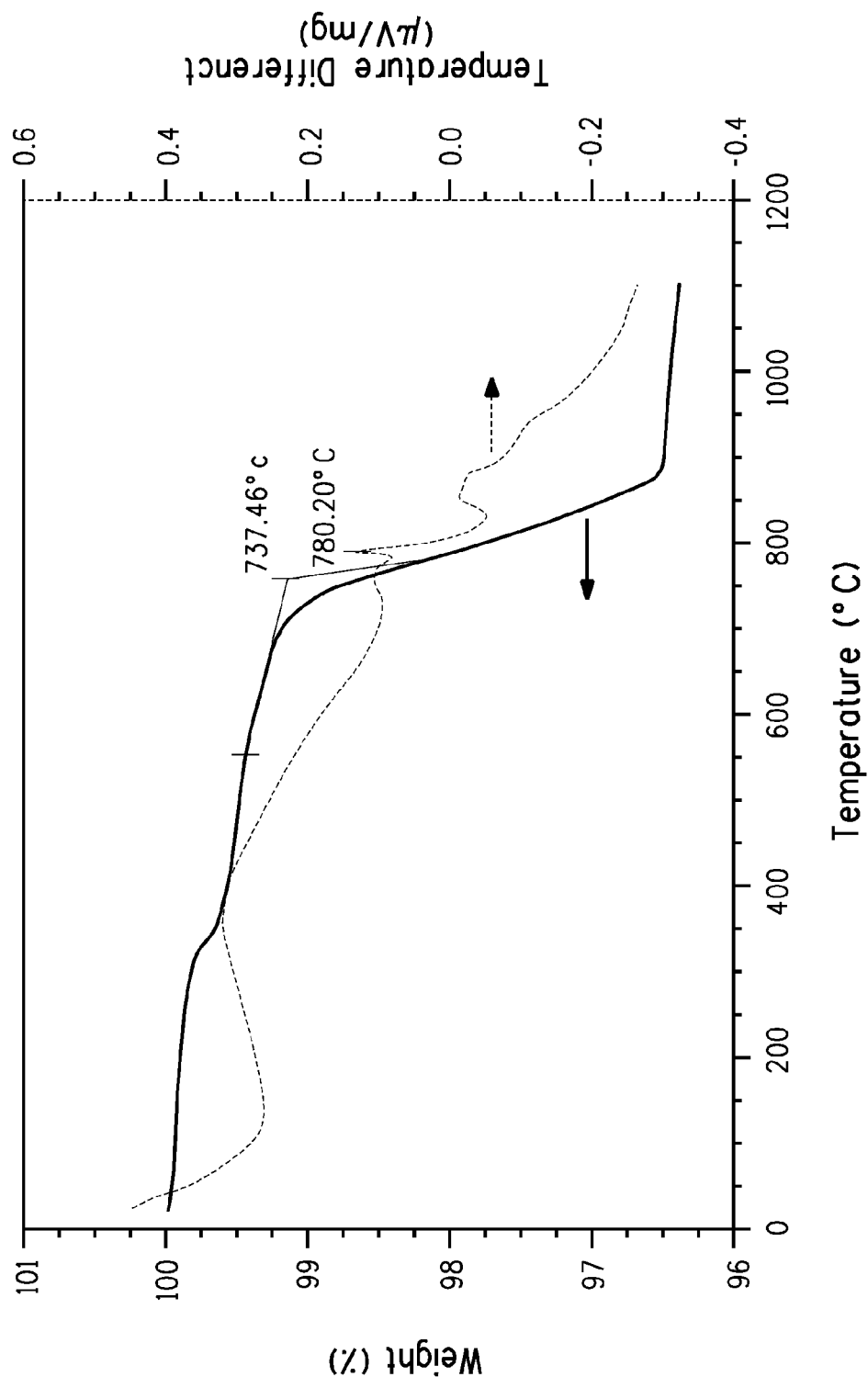
Figure 11:
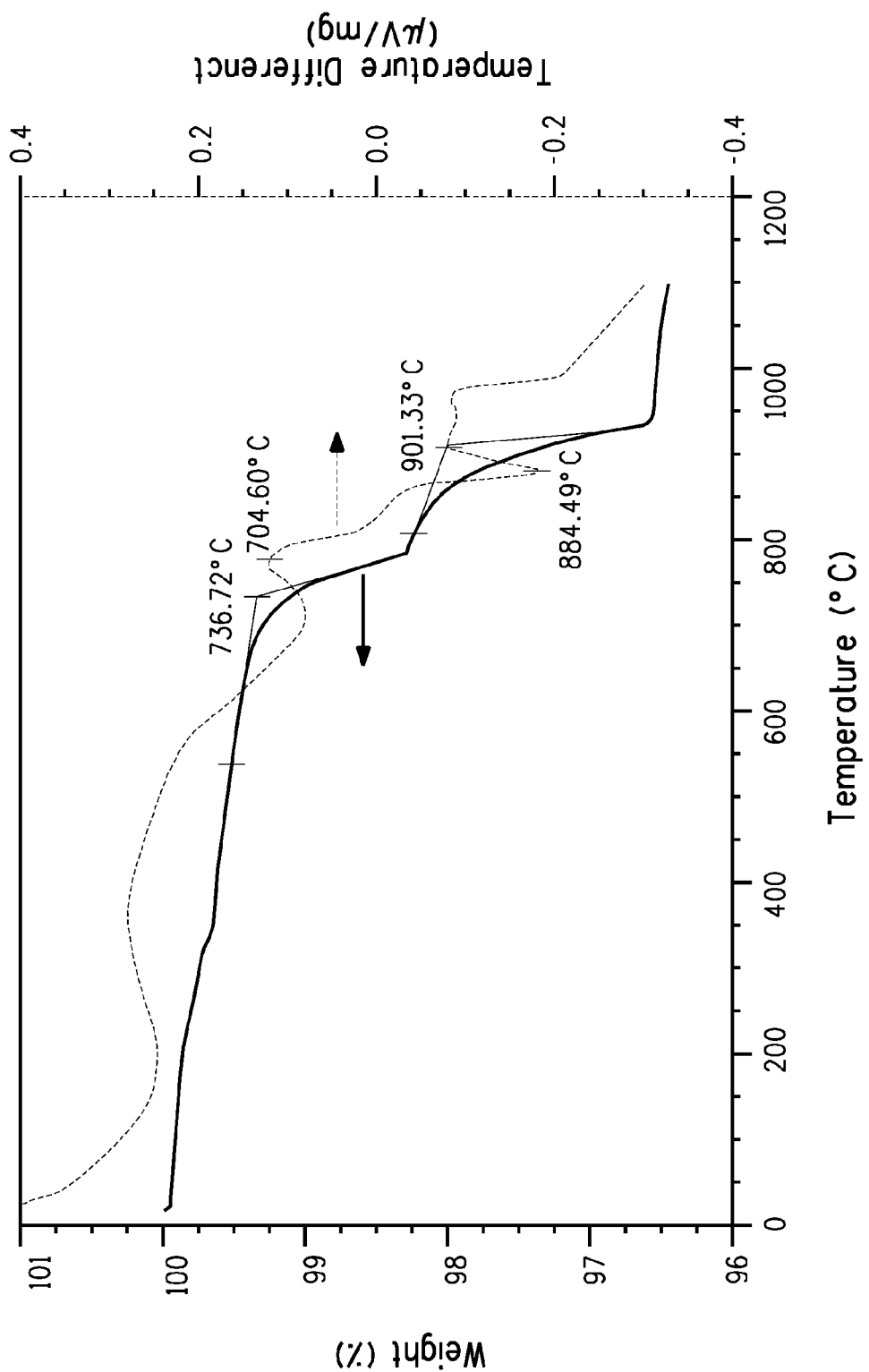

FIG. 6 shows a differential thermal analysis (DTA) and thermal gravimetric analysis (TGA) results of a reaction between nickel and silicon nitride powder FIG. 7 shows the X-ray analysis of the reaction products after the DTA/TGA run of nickel and silicon nitride powder FIG. 8 shows the DTA/TGA results of a reaction between cobalt and silicon nitride powder FIG. 9 shows the X-ray analysis of the reaction products after the DTA/TGA run of cobalt and silicon nitride powder FIG. 10 shows the DTA/TGA results of a reaction between a 70 wt. % silver-30 wt. % copper-3 wt. % cobalt alloy powder and silicon nitride powder FIG. 11 shows the DTA/TGA results of a reaction between a 70 wt. % silver-30 wt. % copper-3 wt. % manganese alloy powder and silicon nitride powder According to common practice, the various features of the drawings discussed below are not necessarily drawn to scale. Dimensions of various features and elements in the drawings may be expanded or reduced to more clearly illustrate the embodiments of the invention.

DETAILED DESCRIPTION OF THE INVENTION

Photovoltaic devices having low Schottky barrier height electrode contacts to n-type silicon are disclosed. Also disclosed are methods for making photovoltaic devices having low Schottky barrier height electrode contacts to n-type silicon. The disclosed photovoltaic devices are solar cells but they may also be other photovoltaic devices having electrode contacts to n-type silicon such as photodetectors or light emitting diodes. The disclosed embodiment is a solar cell with a front face electrode on n-type silicon having a low Schottky barrier height electrode contact comprised of silicides.

As used herein, the term "exchange metal" (M) refers to a metal or mixtures of metals that react with silicon nitride to form stable highly conductive metal and nitrogen gas, and without the formation of metal nitrides. For example exchange metals may react with silicon nitride according to the reaction:

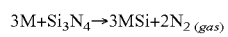
$3M + Si_3N_4 \rightarrow 3MSi + 2N_{2\,(gas)}$

Such metals include metals or mixtures thereof from the group nickel (Ni), cobalt (Co), molybdenum (Mo), manganese (Mn), and iron (Fe). These metals have thermodynamic properties that make this reaction possible.

While MSi is generically shown as the preferred resultant silicide, other metal silicides may form depending on the amount of metal present and the extent of the reaction. Such metal silicides may be described as $M_xSi_y$, wherein M is a metal from the above group, Si is silicon, and x and y can vary depending on metal content and extent of reaction. Compositions include but are not limited to $Ni_3Si$, $Ni_5Si$, $Ni_2Si$, $Ni_3Si_2$, NiSi, $Co_3Si$, $Co_2Si$, CoSi, $Mn_3Si$, $Mn_5Si_3$, MnSi, $Mo_3Si$, $Mo_3Si_2$, $Fe_3Si$, $Fe_5Si_3$, and FeSi. Perfect stoichiometry of the compositions may also not occur.

As used herein, the term "non-exchange metal" refers to a metal or mixture of metals that cannot exchange with the nitrogen of silicon nitride to yield a conducting metal silicide or is inert to silicon nitride. Preferred non-exchange metals have relatively low melting points so that when mixed or alloyed with the exchange metal, the reaction temperature can be reduced and the reaction kinetics can be accelerated. Metal compositions may be designed with multiple elements to achieve the desired melting point by use of eutectic compositions.

The non-exchange metals are also chosen to have relatively low electrical resistivities for current carrying properties. The non-exchange metals may be chosen from, but not limited to, the group of metals, such as silver (Ag), copper (Cu), tin (Sn), bismuth (Bi), lead (Pb), arsenic (As), antimony (Sb), zinc (Zn), gold (Au), cadmium (Cd), and beryllium (Be). Other metals, such as those with high melting points, such as palladium (Pd), for example, may be included in small quantities to achieve other specific properties. Small quantities Group 5A elements (phosphorous, arsenic, antimony, bismuth) may be included, as they may additionally act as donor dopants. The non-exchange metal group typically does not include Group 3 elements of the Periodic Table (boron (B), aluminum (Al), gallium (Ga), indium (In), and thallium (Tl)) as they may acceptor dope the n-type silicon and raise its surface resistivity too high.

The calculated plots of FIG. 2 show the free energy ($\Delta G$) versus temperature between silicon nitride and various exchange metals at a partial pressure of nitrogen of 1 atmosphere. The onset of the reaction temperature of the metal with silicon nitride can be predicted at the point where Delta G, the free energy of reaction, is zero. Thus under an atmosphere of flowing nitrogen at one atmosphere, it is predicted that nickel will only react with silicon nitride at a temperature that exceeds approximately 1250° K. For cobalt, molybdenum, manganese, and iron the reaction temperatures are approximately 1400° K, 1150° K, 1650° K, and 1600° K respectively. These temperatures typically are too high for silicon solar cells processing. However, alloying the exchange metal with a metal that has a low melting point may allow for a lower reaction temperature.

FIG. 3 is a conceptual graph showing how reducing the partial pressure of nitrogen will reduce the temperature of the reaction for nickel. The other metals have similar calculations. An approach, therefore, to lowering the temperature of reaction is to reduce the partial pressure of nitrogen. This may be accomplished by dilution of the nitrogen with a neutral gas, such as argon, for example. Other gases, such as carbon monoxide or hydrogen may also be feasible diluents.

Nickel silicide and cobalt silicide have Schottky barrier height contacts to n-type silicon in the order of 0.6-0.65 eV (electron volt) as shown in FIG. 4 (adapted from "Barrier Heights to n-Silicon", Andrews et al., J. Vac. Sci. Tech 11, 6, 972, 1974). This is similar to silver metal (ev of ~0.65 eV), the conventional contact for n-type silicon in silicon solar cells. Nickel and cobalt silicides are therefore attractive options for low contact resistance contacts to n-type silicon. As use herein, a "low Schottky barrier height" contact to n-type silicon has a contact resistance of less than 0.8 eV.

The metals described above may be deposited on to the silicon nitride by thin film processes including, but are not limited to, sputtering, metal evaporation, chemical vapor deposition, atomic layer deposition, pulsed laser deposition, and the like. The exchange metals and non-exchange metals may be deposited in their elemental state or as separate layers or co-deposited to form mixtures or alloys. Metals deposited by thin film methods are generally deposited as a thin continuous layer onto the surface of the silicon nitride through a mask or photoresist to define the pattern desired.

The metals may also be deposited by thick film processes. Thick film processes including, but not limited to, screen printing, ink jet printing, or photo-imaging techniques. Screen printing is advantageous in that it is a cost effective process. In this case, a paste containing the exchange and non-exchange metals described above, in powder form, are printed through a screen onto the surface of the silicon nitride. The screen defines the pattern desired.

Suitable powders for use in screen printing thick film pastes made from exchange metals should be as free of oxide as possible so that the above reaction is not hindered by the native oxide of the exchange metal. Because exchange metals form oxides in air at room temperature to some predetermined thickness due to their oxidation characteristics, the larger the size of the particles in the powders, the lower the total oxide content. Therefore, it is generally preferable to use powders with the largest particle size consistent with good thick film paste making properties to minimize the oxide level. For optimum thick film paste properties, such exchange metal powders should have an average diameter of between and including any two of the following diameters: 0.2, 0.5, 1, 3, 5 and 10 micrometers, and more preferably between 0.5 and 5 micrometers. Suitable powders made from non-exchange metals should also be as free of oxide as possible. The non-exchange metal powders should have an average diameter of between and including any two of the following diameters: 0.2, 0.5, 1, 3, 5 and 10 micrometers, and more preferably between 0.5 and 5 micrometers.

For thick film deposition, the metal powders described above are mixed with an organic medium by mechanical mixing to form viscous compositions called "thick film pastes", having suitable consistency and rheology for printing. The organic medium is a fugitive material, in that it is burnt off during the initial stages of the firing process. The temperature at which the organic material is completely burnt off depends on the chemistry and amount of organic material in the thick film paste composition and so compositions can be designed to burn off at lower or higher temperatures. The organic medium must be one in which the metal powders are dispersible with an adequate degree of stability. The rheological properties of the medium must be such that they lend good application properties to the composition, including: stable dispersion of metal powders, appropriate viscosity and thixotropy for screen printing or other desired application processes, appropriate paste wettability of the substrate, and a good drying rate. The organic medium used in the disclosed thick film composition is preferably a nonaqueous inert liquid. Use can be made of any of various organic mediums, which may or may not contain thickeners, stabilizers and/or other common additives. The organic medium is typically a solution of polymer(s) in solvent(s). Additionally, a small amount of additives, such as surfactants, may be a part of the organic medium.

The most frequently used polymer of the organic medium is ethyl cellulose. Other useful polymers for the organic medium include ethylhydroxyethyl cellulose, wood rosin, mixtures of ethyl cellulose and phenolic resins, polymethacrylates of lower alcohols, and monobutyl ether of ethylene glycol monoacetate.

The most widely used solvents found in the disclosed thick film compositions are ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. Various combinations of these and other solvents are formulated to obtain the viscosity and volatility properties desired.

The polymer present in the organic medium (polymer and solvent) is in the range of 1 wt. % to 11 wt. % of the composition depending on the polymer chosen. The ratio of organic medium in the thick film composition to the metal components is dependent on the method of applying the paste and the kind of organic medium used, and it can vary. Usually, the thick film composition will contain 70-95 wt % of metal components and 5-30 wt % of organic medium in order to obtain good wetting.

The low Schottky barrier height contact (derived from the exchange of the exchange metal for the nitrongen in the silicon nitride to form the metal silicide) may be approximately the same thickness as the silicon nitride layer (70 to 100 nanometers) or may be as much as several micrometers depending on the firing process, how much exchange metal is deposited and if reaction with the underlying n-type silicon occurs. However, it is also advantageous to form a low resistivity current carrier to carry the current to the outside circuitry. In other words, an electrode or additional metal layer of a low resistance is desirable. This may be accomplished by depositing a non-exchange metal layer over an exchange metal layer prior to the firing process. Another method is to co-deposit the exchange metal with the non-exchange metal in the appropriate quantities. The co-deposition approach may comprise mixtures of metals or an alloy of the exchange metal with the non-exchange metal. The amount of exchange metal in the mixture or alloy composition is tailored to the thickness of the silicon nitride, the exchange metal and the thickness of the deposit. Typically the exchange metal will comprise about 1-40 wt. % of the metals in the composition and the non-exchange metal will comprise 99-60 wt. % of the metals in the composition.

A solar cell having low Schottky barrier height electrode contacts as described herein may be manufactured by the following method.

Figure 5A:
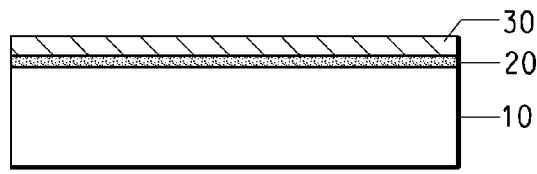
Figure 5B:
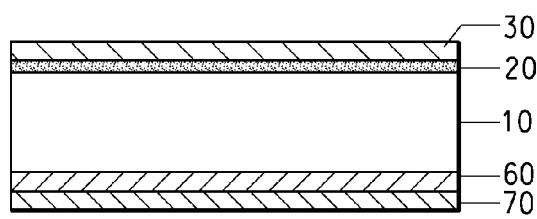

Referring to FIG. 5, the article shown in FIG. 5A is provided. The article may comprise single-crystal silicon or multicrystalline silicon, and includes a p-type silicon substrate 10, an n-type diffusion layer 20, and an anti-reflective coating 30 The article shown in FIG. 5A may be prepared as described above with regard to the article shown in FIG. 1D.

Figure 1D:
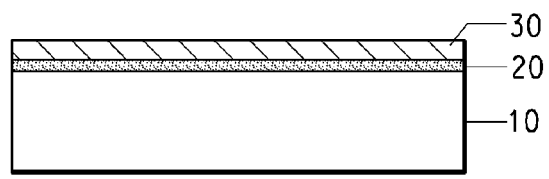
Figure 1E:
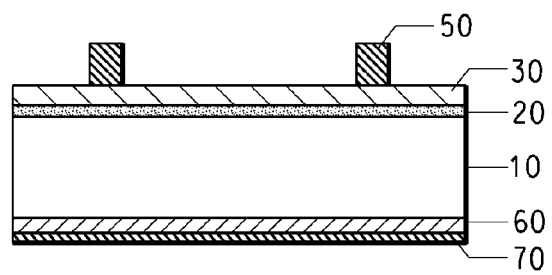
Figure 1F:
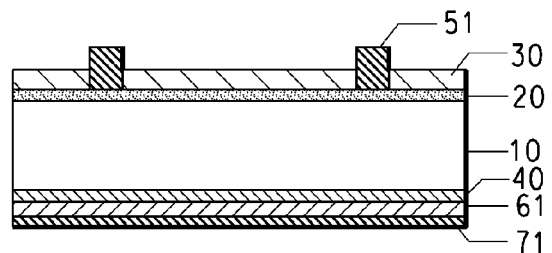
Figure 2A:
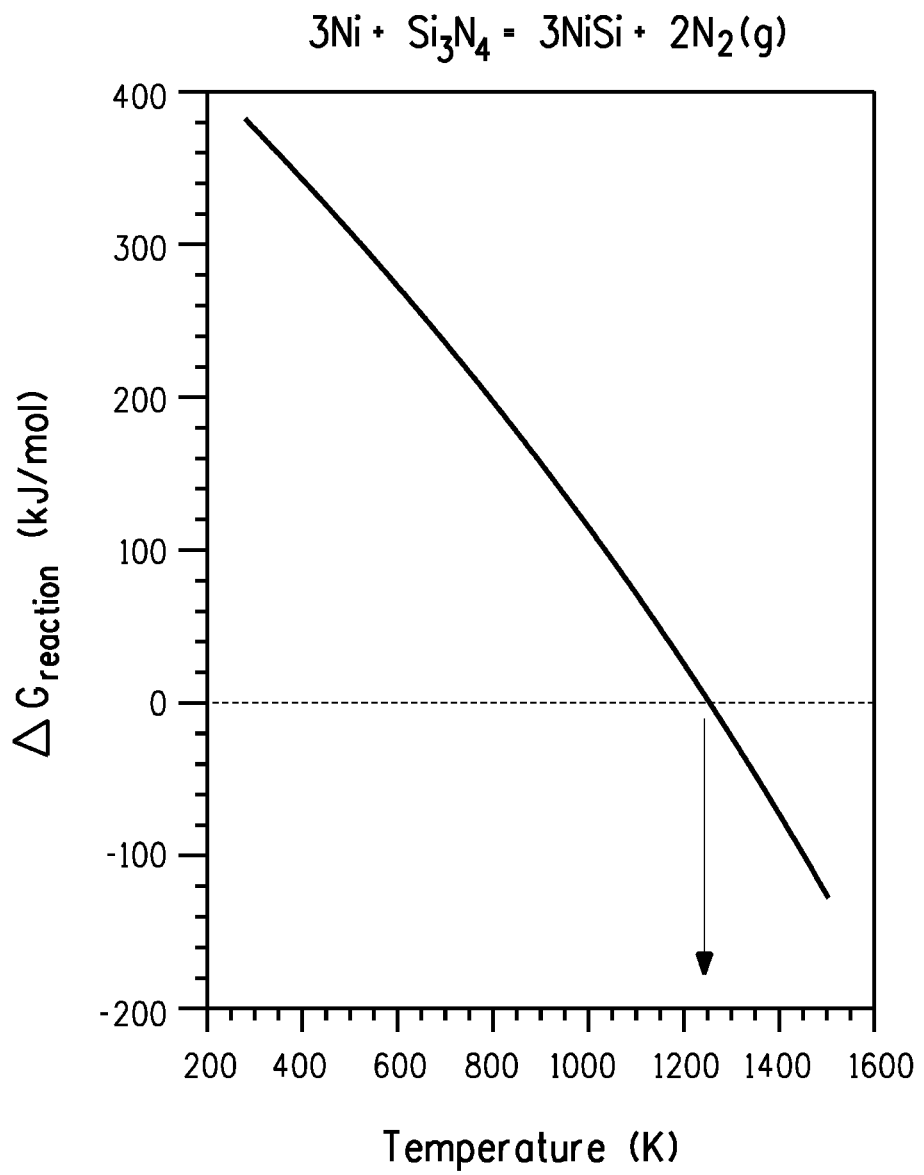
Figure 2B:
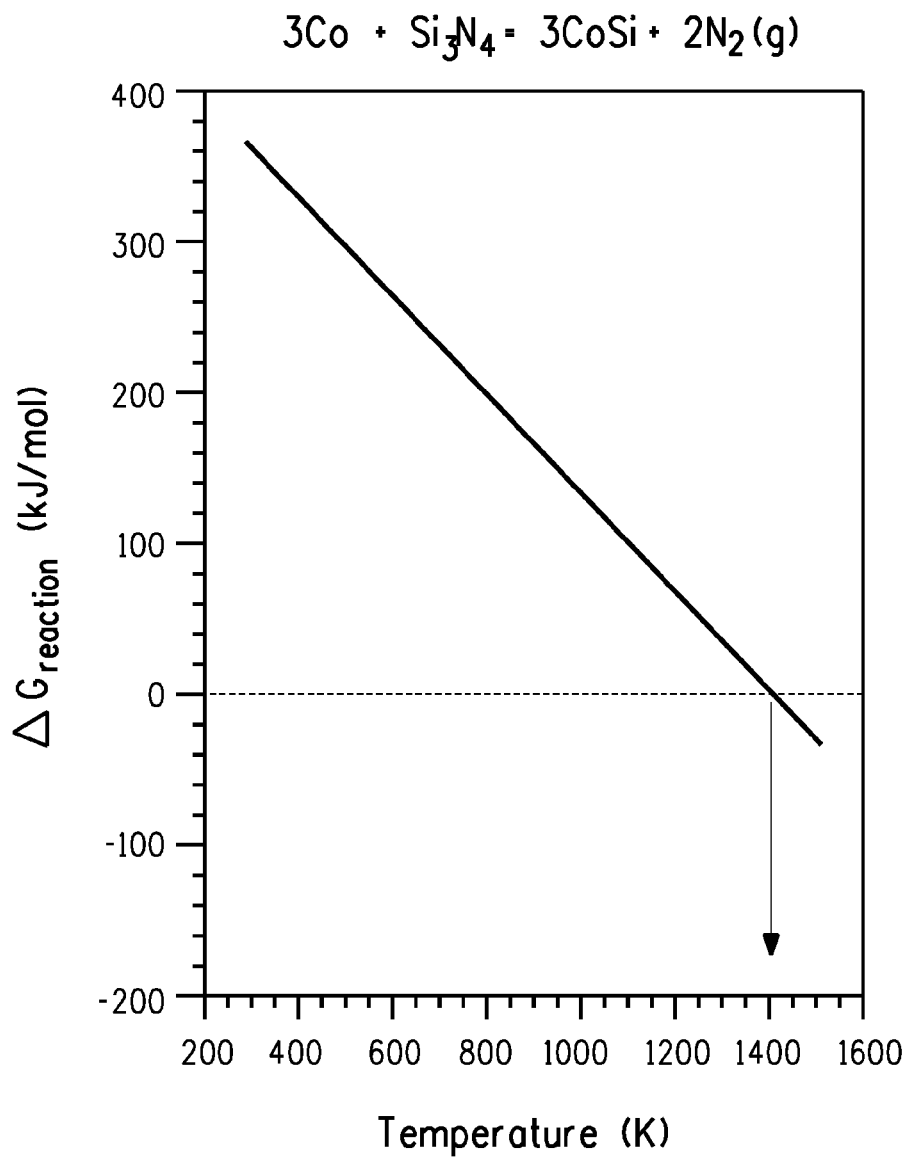
Figure 2C:
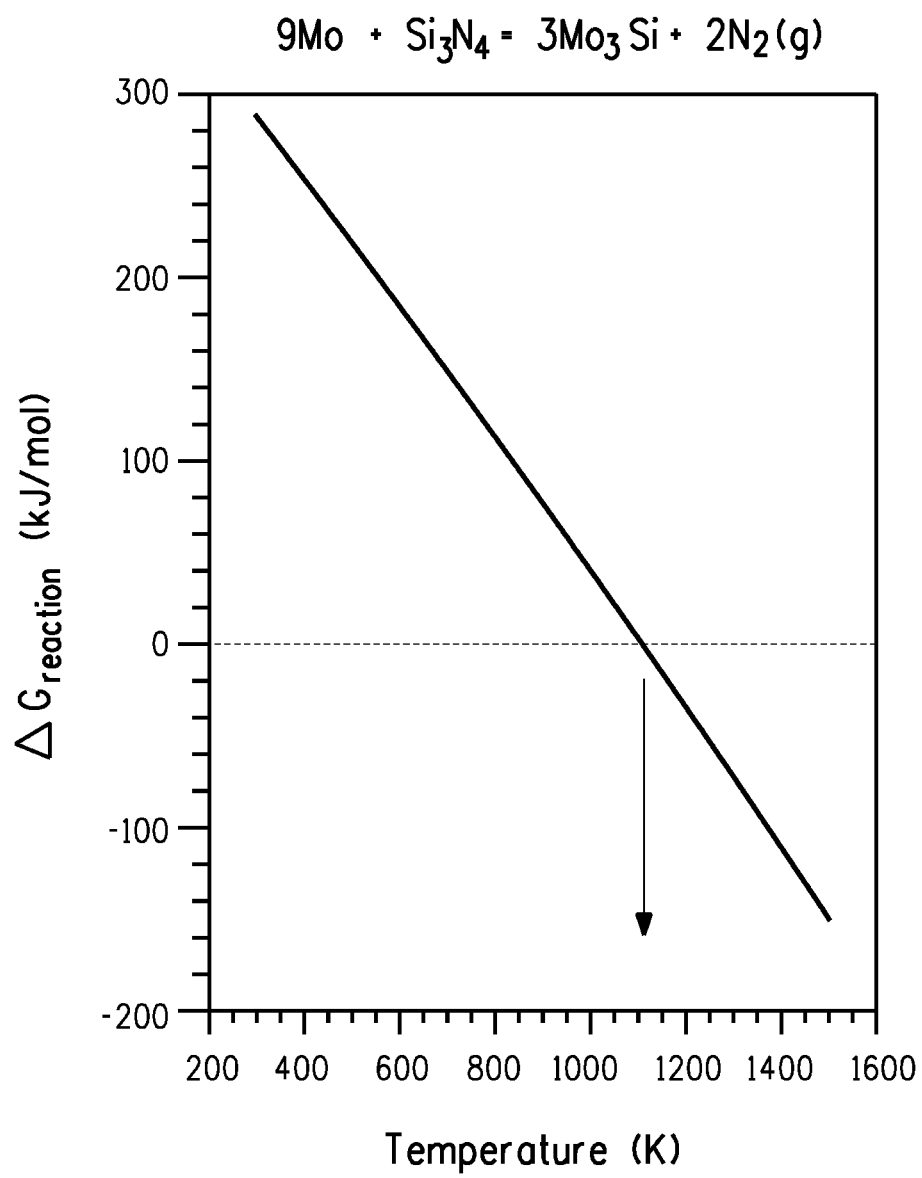
Figure 2D:
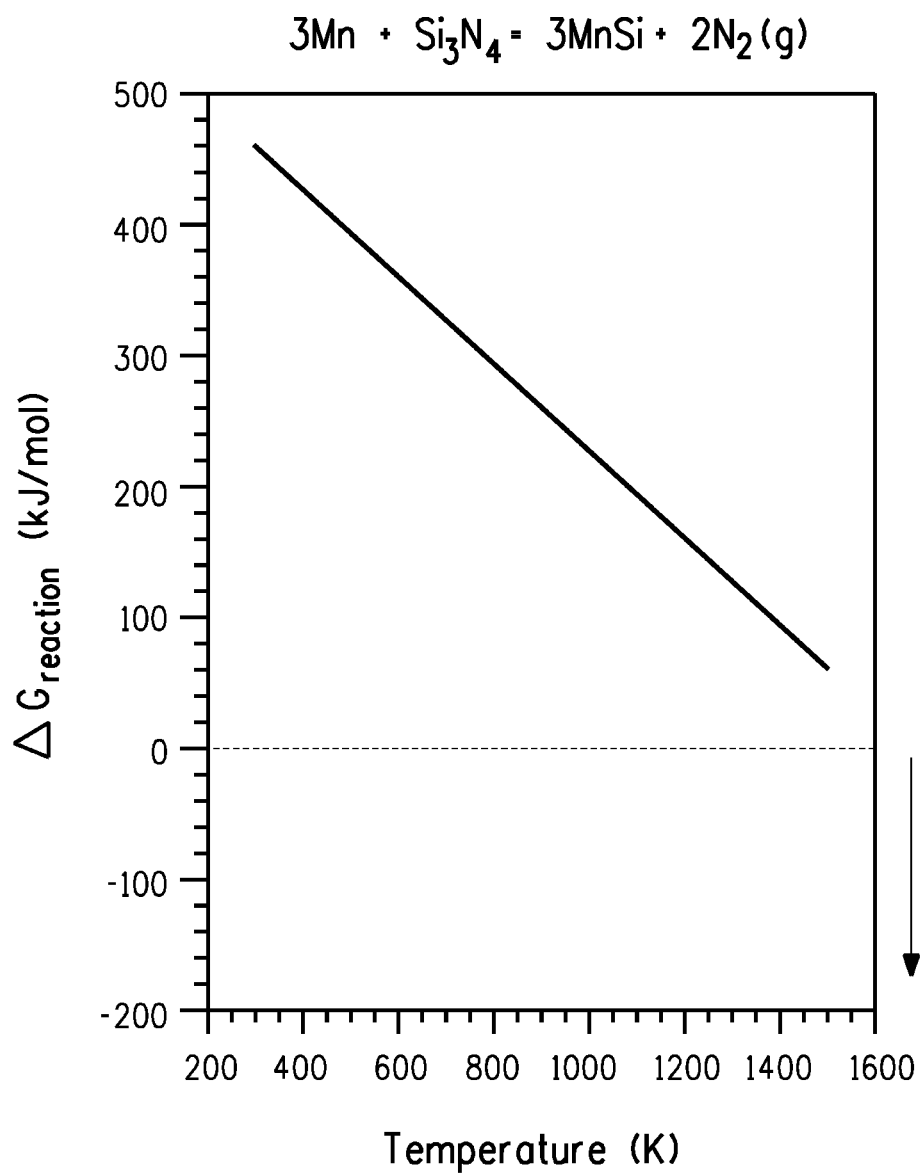
Figure 2E:
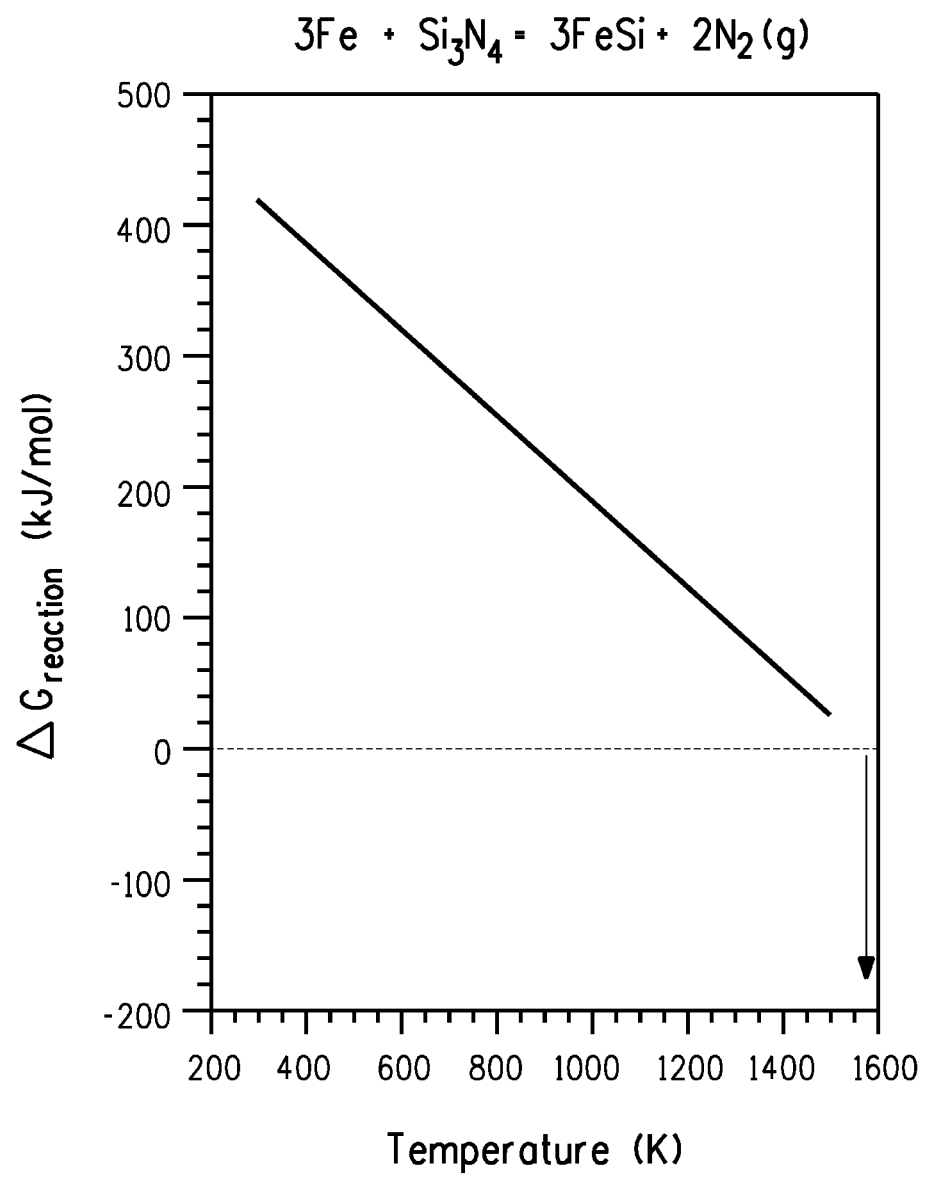

Referring to FIG. 5, the article of FIG. 1D is provided and shown as FIG. 5A. Referring to FIG. 5B, an aluminum paste 60 and a backside silver or silver/aluminum paste 70 are successively screen printed and dried on the backside of the substrate. Firing of the backside pastes is then carried out in an infrared furnace at a temperature range of approximately 700° C. to 975° C. in air for a period of from several minutes to several tens of minutes. The firing produces the article of FIG. 5C.

Figure 5C:
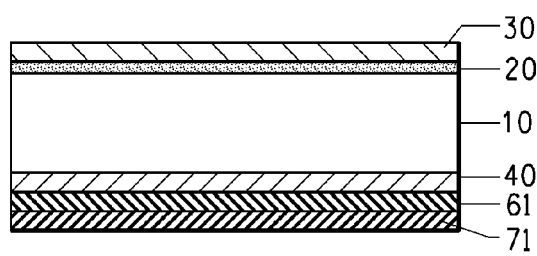

Referring to FIG. 5C, as in the conventional process, aluminum diffuses from the aluminum paste into the silicon substrate 10 as a dopant during firing, forming a p+ layer 40 containing a high concentration of aluminum dopant.

Firing converts the aluminum paste 60 to an aluminum back electrode 61. The backside silver or silver/aluminum paste 70 is fired at the same time, becoming a silver or silver/aluminum back electrode 71. During firing, the boundary between the back side aluminum and the back side silver or silver/aluminum assumes an alloy state, thereby achieving electricial connection. The aluminum electrode accounts for most areas of the back electrode, owing in part to the need to form a p+ layer 40. Because soldering to an aluminum electrode is impossible, a silver back tab electrode is formed over portions of the back side as an electrode for interconnecting solar cells by means of copper ribbon or the like.

Figure 5D:
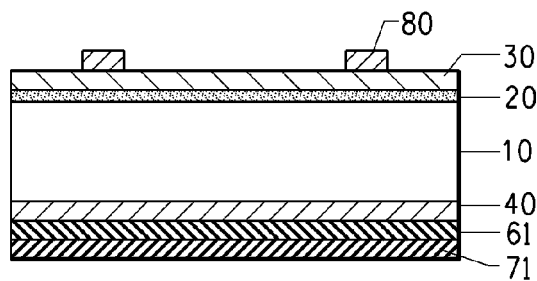

The novel exchange metal composition(s) described herein is now applied by thick film or thin film deposition processes, onto the silicon nitride insulating film 30 in a pattern corresponding to the fingers and/or bussbars of the front electrode, shown as 80 in FIG. 5D. The deposition may be accomplished with separate deposition of the exchange metal followed by the non-exchange metal on to the same pattern (both layers shown as the single layer 80 in FIG. 5D) or by a single deposition of a mix of exchange and non-exchange metals or an exchange metal/non-exchange metal alloy.

The deposited metal composition(s) is now fired. Firing is typically undertaken in a furnace at a temperature within the range of 400° C. to 950° C., the actual temperature depending upon the metal composition. Firing at a temperature at the lower end of this range may be preferred because oxidation of the metals will be much reduced. Firing may be undertaken in a protective atmosphere that may comprise vacuum, pure nitrogen gas, a mixture of hydrogen and nitrogen, or mixtures of other gases such as argon, carbon monoxide and/or water. Such gas mixtures may be used to control the partial pressure of oxygen and nitrogen during the firing process to avoid oxidation of the exchange metals and the non-exchange metals. The exact partial pressure of oxygen ($PO_2$) required to prevent oxidation is dependent on the metal compositions. Atmospheres that fully protect the metals from oxidation can be thermodynamically derived from standard free energy of formation of oxides as a function of temperature calculations or diagrams as disclosed in "F. D. Richardson and J. H. E Jeffes, J. Iron Steel Inst., 160, 261 (1948)". In general, however, a partial pressure of oxygen ($PO_2$) of between approximately $10^{-6}$ to $10^{-14}$ atmospheres is suitable. This can be generally accomplished by the use of pure nitrogen, carbon monoxide/carbon dioxide mixtures, argon, forming gas (1-4% hydrogen in nitrogen), a mixture of hydrogen and argon, or vacuum. Use of a neutral gas, such as argon may be advantageous as it will dilute the nitrogen and reduce the temperature of reaction. Carbon dioxide and carbon monoxide may also be used to dilute the nitrogen. For additional protection, an in-situ reducing atmosphere comprising carbon monoxide and hydrogen may be deliberately formed during the pyrolysis of organic mediums. Mediums that do not burn off until higher temperatures may accomplish this. Additionally, organic material specifically designed to create carbon monoxide and hydrogen during their decomposition may be added to the paste. Such additions include formates, acetates and the like. The in-situ reducing environment from the pyrolysis of the organic content can be adjusted by the chemistry and content of the organic medium so that in some circumstances, firing in air may be accomplished without the use of a protective atmosphere. Oxygen getters, such as titanium plates or setters may also be used to scavenge oxygen from the gases or a protective flux may be used.

In cases where protection by an appropriate flux is utilized, firing in air may be feasible. Fluxes are well known in soldering, brazing and welding of metals and are used to coat and protect the molten metal from oxidation. Fluxes for exchange metals can be mixtures of the fluorides and chlorides of Group 1 metals of the periodic table, such as sodium, lithium, potassium and cesium, for example. Other compounds, such as ammonium chloride, ammonium hydrogen phosphate, boric acid, boron, borax, and organic halides, for example, may be included. The flux may be applied as a paste to form a layer over the surface of the exchange metal layer (not shown in the figures) or flux powders may be added to the thick film metal paste when thick film deposition processes are used. The fluxes may even be used as a coating on the powders. The fluxes can be formulated to melt at relatively low temperatures and can dissolve oxides of metals so that they maintain an oxide free clean surface and the fluxes can be made water soluble so they can be washed off after the firing process.

Ideally, in a thick film process, if a flux is incorporated into the thick film paste, the flux is formulated to melt at a temperature slightly before the organic medium is pyrolysed. Up to and during the pyrolysis of the organic medium, a protective environment will exist due to the organic content of the deposit. Once pyrolysis is complete the inorganic flux assumes the role of protection.

It may be preferential to form a molten exchange metal alloy in the firing process. A molten metal allows for a reduction in the transformation reaction temperature due to an acceleration of the transformation kinetics via assistance of the liquid phase. In the case wherein the exchange metal is deposited first followed by the non-exchange metal or in the case where both metals are deposited as a mixture, the non-exchange metal melts and rapidly dissolves the exchange metal forming a molten alloy. In the case of a deposited alloy, the metal melts to form the molten alloy. While the metal is molten, the exchange metal preferentially migrates through the molten metal to the silicon nitride interface and reacts with the silicon nitride to form the exchange metal silicide. As the exchange metal is depleted at the interface, more exchange metal migrates to the interface to react. This continues until either the exchange metal in the molten alloy is consumed in forming the metal silicide or the reaction is terminated by cessation of the firing process. The inclusion of the molten metal in the process accelerates the kinetics of transforming the silicon nitride to the exchange metal silicide so that the firing can be accomplished at a relatively low temperature, such as between 400° C. and 950° C.

Figure 5E:
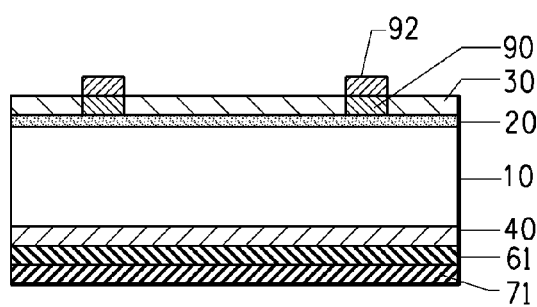

Referring to FIG. 5E, the firing forms an electrode comprising the following elements: a) a silicide first layer 90 formed from the transformation of the anti-reflective coating 30 that is reactively bonded to the underlying n-type silicon 20, b) a metal second layer 92 formed from the molten metal. If a flux is used in the process, it will reside on the surface of the electrode after firing and can be washed off after the firing.

While it may be preferential to form a molten exchange metal alloy during the firing process, it is entirely feasible that the firing not melt the non-exchange metal and that the transformation process occurs in the solid state without melting. Finally, it is also feasible that the process steps described herein can be modified so that the novel composition(s) described herein may be co-fired with the backside pastes.

EXAMPLES

Example 1

A 1:1 volume ratio of 1 micrometer diameter nickel powder and crystalline silicon nitride powder mixture was prepared using a mortar and pestle. A simultaneous differential thermal analysis and thermal gravimetric analysis (DTA/TGA) was run by heating the mixture under nitrogen to approximately 1300° C. The mixture was contained in an alumina crucible during the run. The nitrogen flow rate was 100 mL/min. The heating rate was 10° C./min. FIG. 6 shows the results of the DTA/TGA run. As can be seen by the TGA, a reaction started at approximately 1225° C. resulting in approximately a 10% weight loss indicating release of nitrogen from the silicon nitride. At the same temperature, an endotherm was observed on the DTA run indicating melting. As nickel melts at 1453° C., the melting endotherm indicates that alloying of nickel and silicon has occurred. From the nickel-silicon phase diagram, in "Constitution of Binary Alloys", Max Hansen, Second Edition, McGraw Hill, 1958, 10% by weight of silicon alloyed with nickel reduces the melting point to approximately 1200° C. FIG. 7 shows the X-ray diffraction of the mixture after the TGA/DTA run. It shows large amounts of nickel silicide present confirming that the melting endotherm was due to nickel silicide formation. Some unreacted nickel and residual amounts of unreacted silicon nitride were also present.

Example 2

A 1:1 volume ratio of 1 micrometer diameter cobalt powder and crystalline silicon nitride powder mixture was prepared using a mortar and pestle. A simultaneous DTA/TGA was run by heating the mixture under nitrogen to approximately 1300° C. The mixture was contained in an alumina crucible during the run. The nitrogen flow rate was 100 mL/min. The heating rate was 10° C./min. FIG. 8 shows the results of the DTA/TGA run. As can be seen by the TGA a reaction started at approximately 1137° C. resulting in a weight loss of approximately 9% suggesting release of nitrogen from the silicon nitride. At a similar temperature an endotherm was observed on the DTA run indicating melting. Since cobalt melts at 1495° C., the melting endotherm suggests that alloying of cobalt and silicon has occurred. From the cobalt-silicon phase diagram, in "Constitution of Binary Alloys", Max Hansen, Second Edition, McGraw Hill, 1958, approximately 12% by weight of silicon alloyed with cobalt reduces the melting point to approximately 1200° C. FIG. 9 shows the X-ray diffraction of the mixture after the TGA/DTA run. It shows large amounts of cobalt silicide were present. While the TGA showed that melting occurred at 1141° C. and the phase diagram indicates that the lowest melting temperature of cobalt silicide is approximately 1200° C., the difference is sufficiently small so as to suggest that the melting was that of a cobalt silicide, and that the melting point possibly was reduced slightly by the presence of nitrogen. Some unreacted cobalt was also present. No detectable silicon nitride was present.

Example 3

A 70 wt. % silver—27 wt. % copper—3 wt. % manganese alloy powder was mixed with silicon nitride powder in a 1:1 volume ratio using a mortar and pestle. A simultaneous DTA/TGA was run by heating the mixture under nitrogen to approximately 1300° C. The mixture was contained in an alumina crucible during the run. The nitrogen flow rate was 100 mL/min. The heating rate was 10° C./min. FIG. 10 shows the results of the DTA/TGA run. As can be seen by the TGA, a reaction started at approximately 737° C. resulting in a weight loss of a little less than 3% suggesting release of nitrogen from the silicon nitride. At around 780° C., a small exotherm and a small endotherm was observed on the DTA run indicating a reaction took place at the exotherm point and melting took place at the endotherm point. Additionally, an endotherm is seen at approximately 810° C. Because the silver-copper ratio would create an alloy with a melting point of 779° C., and manganese would increase the melting point somewhat, the endotherm at 810° C. indicates melting of the alloy took place.

Example 4

A 70 wt. % silver—27 wt. % copper—3 wt. % cobalt alloy powder was mixed with silicon nitride powder in a 1:1 volume ratio using a mortar and pestle. A simultaneous DTA/TGA was run by heating the mixture under nitrogen to approximately 1300° C. The mixture was contained in an alumina crucible during the run. The nitrogen flow rate was 100 mL/min. The heating rate was 10° C./min. FIG. 11 shows the results of the DTA/TGA run. As can be seen by the TGA a reaction started at approximately 737° C. resulting in a weight loss of a little less that a 3% indicating release of nitrogen from the silicon nitride. At a similar temperature, an exotherm occurred and at the higher temperature of approximately 885° C., an endotherm was observed on the DTA run indicating melting of the alloy.

Examples 1 and 2 show that silicon nitride can be reacted with cobalt and nickel powders to form silicides with evolution of nitrogen. When reacted under nitrogen, the onset of the reaction occurs at approximately 1225° C. for nickel and 1137° C. for cobalt. These are somewhat different temperatures than suggested by the thermodynamic calculations of FIG. 3. The difference may be due to the fact that not all silicides formed were stoichiometric 1:1 metal silicides and therefore the free energy of formation may be slightly different from that predicted.

Examples 3 and 4 were reactions of silicon nitride powder with alloy powders that have significantly lower melting points than nickel or cobalt. The ratio of 70 weight percent silver to 27 weight percent copper represents the eutectic composition of silver and copper. Its melting point is 779° C. Manganese melts at 1245° C. and so the addition of 3 weight % manganese to the copper silver eutectic composition raises the melting point to a little over 800° C. Cobalt melts at 1495° C. and so a 3 weight % cobalt addition to the copper silver eutectic raises the melting point to approximately 880° C. This is shown in the DTA runs. The amount of cobalt or manganese was designed to be the approximate amount needed in a low melting point alloy when used as a silicon solar cell front face metallization. As seen in the TGA runs, a reaction begins at about 737° C. for both alloys that causes a weight loss of a little less than 3%. X-ray analysis of the reacted powder was not sensitive enough to show any silicide level due to the low level of concentration. While not definitely proven, the weight loss is most probably nitrogen evolution confirming that a relatively low melting point alloy that contains a small amount of an exchange metal content will react with silicon nitride at an attractive temperature to form a low Schottky barrier height metal silicide layer along with a primarily non-exchange metal layer that can function as a current carrier.

What is claimed is:

1. A method for making a photovoltaic device, comprising:
providing a silicon substrate having a p-type silicon base and an n-type silicon layer,
forming a silicon nitride layer on the n-type silicon layer of the silicon substrate,
placing an exchange metal in contact with said silicon nitride layer formed on the n-type silicon layer of the silicon substrate, and not in physical contact with said silicon substrate and not in physical contact with said n-type silicon layer of said silicon substrate,
placing a non-exchange metal in contact with said exchange metal,
firing said silicon substrate, silicon nitride layer, exchange metal and non-exchange metal to react the exchange metal with the silicon nitride layer to form a metal silicide contact to said n-type silicon layer and a conductive metal electrode in contact with said metal silicide contact.

2. The method of claim 1 wherein the exchange metal is one or more metals from the group of nickel, cobalt, iron, molybdenum, and manganese.

3. The method of claim 1 wherein the non-exchange metal is one or more metals from the group of silver, copper, tin, bismuth, lead, arsenic, antimony, zinc, gold, cadmium, and beryllium.

4. The method of claim 1 wherein the exchange metal placed in contact with said silicon nitride layer and the non-exchange metal is placed in contact with said exchange metal are both coated with a flux.

5. The method of claim 1 wherein the exchange metal and the non-exchange metal are combined to form a metals composition, and said metals composition is subsequently deposited on said silicon nitride layer.

6. The method of claim 2 wherein the exchange metal is in the form of particles having an average diameter of between and including any two of the following diameters: 0.2, 0.5, 1, 3, 5 and 10 micrometers.

7. The method of claim 3 wherein the non-exchange metal is in the form of particles having an average diameter of between and including any two of the following diameters: 0.2, 0.5, 1, 3, 5 and 10 micrometers.

8. The method of claim 5 wherein exchange metal and the non-exchange metal of the metals composition are in the form of an alloy of exchange and non-exchange metals, and said alloy is in the form of alloy metal particles having an average diameter of between and including any two of the following diameters: 0.2, 0.5, 1, 3, 5 and 10 micrometers.

9. The method of claim 8 wherein the exchange metal forms between 1 and 40 weight percent of the total metals in said metals composition.

10. The method of claim 8 wherein the alloy metal particles are coated with a flux.

11. The method of claim 1 wherein said silicon substrate, silicon nitride layer, exchange metal and non-exchange metal are fired at a temperature between 400° C. and 950° C.

12. The method of claim 11 wherein the silicon substrate, silicon nitride layer and exchange metal are fired in a low oxygen atmosphere having an oxygen partial pressure less than or equal to $10^{-6}$ atmospheres.

13. A method for making a silicon solar cell, comprising:
providing a silicon substrate having a p-type silicon base and an n-type silicon layer,
forming a silicon nitride antireflective layer on the n-type silicon layer of the silicon substrate,
placing an exchange metal in contact with said silicon nitride antireflective layer formed on the n-type silicon layer of the silicon substrate, and not in physical contact with said silicon substrate and not in physical contact with said n-type silicon layer of said silicon substrate,
placing a non-exchange metal in contact with said exchange metal,
firing said silicon substrate, silicon nitride layer, exchange metal and non-exchange metal to react the exchange metal with the silicon nitride layer to form a metal silicide contact to said n-type silicon layer and a conductive metal electrode in contact with said metal silicide contact.

14. The method of claim 13 wherein the exchange and non-exchange metals are placed in contact with the silicon nitride antireflective layer by thin film deposition.

15. The method of claim 13 wherein the exchange and non-exchange metals are placed in contact with the silicon nitride antireflective layer by thick film deposition.

16. The method of claim 13 wherein the thickness of the antireflective coating is in the range of 70 to 100 nanometers.

17. The method of claim 13 wherein the exchange metal is one or more metals selected from nickel, cobalt, iron, manganese, molybdenum,
and wherein the non-exchange metal is one or more metals selected from silver, copper, tin, bismuth, lead, antimony, arsenic, zinc, gold, cadmium, and beryllium.

* * * * *